(12) United States Patent
Sherbin et al.

(10) Patent No.: US 11,171,031 B2
(45) Date of Patent: Nov. 9, 2021

(54) DIE MATRIX EXPANDER WITH PARTITIONED SUBRING

(71) Applicant: Texas Instruments Incorporated, Dallas, TX (US)

(72) Inventors: Matthew John Sherbin, Dallas, TX (US); Michael Todd Wyant, Dallas, TX (US); Dave Charles Stepniak, Allen, TX (US); Hiroyuki Sada, Beppu (JP); Shoichi Iriguchi, Beppu (JP); Genki Yano, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 768 days.

(21) Appl. No.: 16/041,888

(22) Filed: Jul. 23, 2018

(65) Prior Publication Data
US 2020/0027772 A1  Jan. 23, 2020

(51) Int. Cl.
| H01L 21/683 | (2006.01) |
| B28D 5/00 | (2006.01) |
| H01L 21/78 | (2006.01) |
| H01L 21/687 | (2006.01) |

(52) U.S. Cl.
CPC ........ *H01L 21/6836* (2013.01); *B28D 5/0052* (2013.01); *H01L 21/68714* (2013.01); *H01L 21/78* (2013.01)

(58) Field of Classification Search
CPC ............................................. H01L 2221/68336
See application file for complete search history.

(56) References Cited

U.S. PATENT DOCUMENTS

| 6,830,990 B1 | 12/2004 | Honer et al. | |
| 9,136,173 B2 | 9/2015 | Grivna | |
| 2006/0005911 A1* | 1/2006 | Kubo | H01L 21/6836 156/84 |
| 2008/0032489 A1* | 2/2008 | Formosa | H01L 21/67132 438/464 |
| 2008/0105383 A1* | 5/2008 | Kubo | H01L 21/6835 156/494 |
| 2014/0339673 A1* | 11/2014 | Shoichi | H01L 21/78 257/499 |
| 2018/0308711 A1* | 10/2018 | Obata | H01L 21/6836 |

* cited by examiner

*Primary Examiner* — Alia Sabur
(74) *Attorney, Agent, or Firm* — Ronald O. Neerings; Charles A. Brill; Frank D. Cimino

(57) ABSTRACT

A die matrix expander includes a subring including ≥3 pieces, and a wafer frame supporting a dicing tape having an indentation for receiving pieces of the subring. The subring prior to expansion sits below a level of the wafer frame and has an outer diameter <an inner diameter of the wafer frame. A translation guide coupled to the subring driven by mechanical force applier moves the subring pieces in an angled path upwards and outwards for stretching the dicing tape including to a top most stretched position above the wafer frame that is over or outside the wafer frame. A cap placed on the pieces of the subring after being fully expanded over the dicing tape locks the dicing tape in the top most stretched position and secures the pieces of the expanded subring in place including when within the indentation during an additional expansion during a subsequent die pick operation.

20 Claims, 3 Drawing Sheets

DIE MATRIX EXPANDER WITH PARTITIONED SUBRING

FIELD

This Disclosure relates to die matrix expanders.

BACKGROUND

Semiconductor die are typically manufactured by dicing a wafer having a plurality of semiconductor die of a predetermined die size being 6 inches in diameter (150 mm), 8 inches (200 mm) in diameter, or 12 inches (300 mm) in diameter, into a plurality of singulated die. When dicing a wafer, an adhesive dicing tape is attached on a back side surface of the wafer to prevent the die from falling apart, and then the wafer is cut from the top side using a saw to singulate the die, typically a mechanical dicing saw. Mechanical dicing saws provide die separations of generally about 40 µm, so that the scribe lines between the die are made wide enough for such cuts. At this time, the dicing tape attached to the back surface of the wafer is slightly cut into its surface but not entirely cut off, and the semiconductor die remain held on the dicing tape. After singulation, a wafer expander is used to spread apart the singulated die to better enable a die picker to pick up die one-by-one from the dicing tape, and to then be transferred to a subsequent assembly step such as a die bonding step.

Laser saws for dicing are known as alternative to mechanical dicing saws. Laser saws produce die separations much less than mechanical saws, typically separations of only about 2 µm. This enables the scribe lines between the die to be reduced when compared to when mechanical saws are used. Such a small die spacing makes die matrix expanders particularly important for die picking so that the die have a low incidence of edge chipping which can cause scrapped die.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize the expanding of a subring assembly of a conventional die matrix expander to try to enable a larger pick area is not possible due to the wafer frame (its inner diameter) being in the way of subring insertion. This Disclosure solves this problem by providing a die matrix expander with a partitioned subring that has 3 or more separate pieces which enables inserting a subring with a diameter larger than the inner diameter of a wafer frame. Disclosed partitioned subrings expand in area in their path of travel up including after passing the wafer frame to provide an area larger than the inner diameter of the wafer frame by utilizing a bidirectional (biaxial) path of travel that includes an outward component in its path which begins when below the wafer frame with a diameter less than the wafer frame. As a result, the subring when above the wafer frame provides a larger area as compared to the inner diameter of the wafer frame.

BRIEF DESCRIPTION OF THE DRAWINGS

Reference will now be made to the accompanying drawings, which are not necessarily drawn to scale, wherein.

DETAILED DESCRIPTION

Figure 1A:
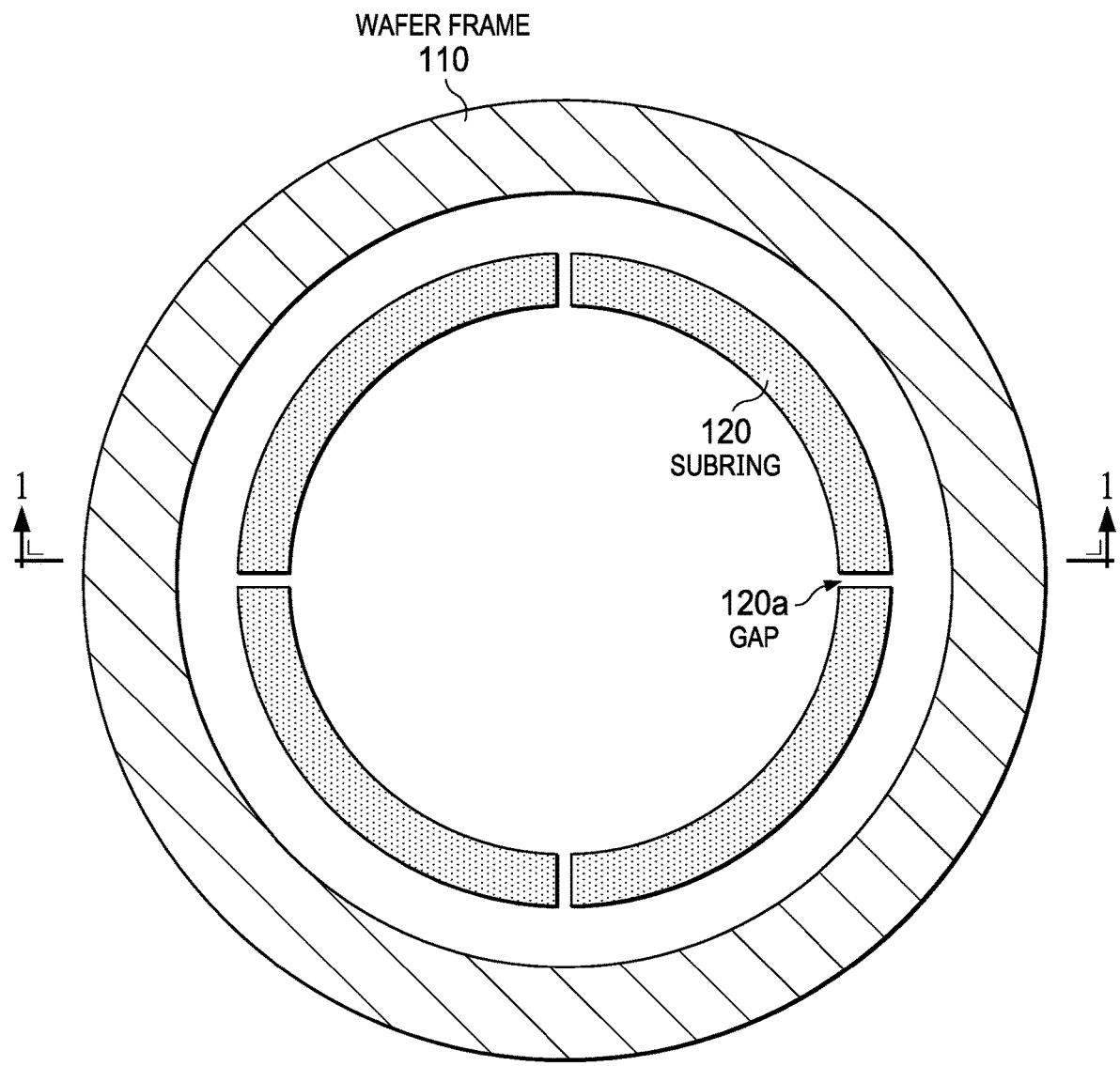
FIG. 1A is a top view depiction of a wafer frame and a partitioned subring of a disclosed die matrix expander before expansion, where the wafer frame is above the level of the subring and the inner diameter of the wafer frame is larger than the outer diameter of the subring, with exaggerated gaps shown between the subring pieces to more clearly show the pieces, according to example aspects.

Example aspects in this Disclosure are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
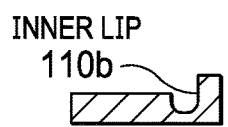
FIG. 1B is a side sectional view of what is shown FIG. 1A along the sectional lines 1-1 in FIG. 1A.
Figure 1B:
Figure 1B:
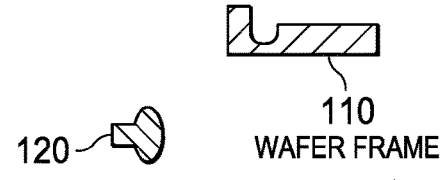

FIG. 1A is a top view depiction of a wafer frame 110 and a partitioned subring 120 of a disclosed die matrix expander before expansion, where the wafer frame 110 is above the level of the subring 120, and the inner diameter of the wafer frame 110 is larger than the outer diameter of the subring 120. The wafer frame 110 includes an inner opening. There are gaps 120a in the subring 120 shown exaggerated in size between the pieces of the subring 120, shown as 4 separate pieces, to more clearly show the separate pieces. The separate pieces enable expansion of area of the subring 120 upon an upward and outward travel path during expansion operation. The subring 120 is generally 1 mm to 8 mm thick, such as being 3 mm to 5 mm thick. FIG. 1B is a side sectional view of what is shown FIG. 1A along the sectional lines 1-1 in FIG. 1A.

Figure 2A:
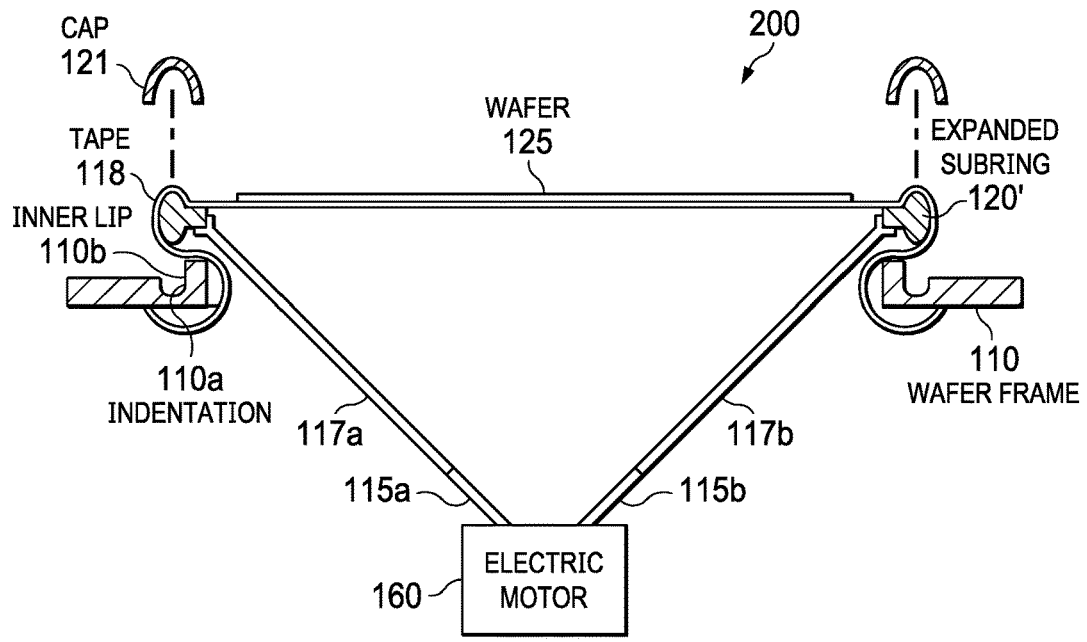
FIG. 2A is side view depiction a disclosed die matrix expander after expansion showing the wafer frame and the partitioned subring after expansion, including showing a singulated wafer on a tape, and the wafer frame including an indentation, and caps for locking the tape in place on top of the subring. Due to the expansion during its path of travel up and outward the subring is above the level of the wafer frame and the inner diameter of the wafer frame is larger than the outer diameter of the subring.

FIG. 2A is a side sectional view depiction of a disclosed die matrix expander 200 again along the sectional lines 1-1 in FIG. 1A after expansion of the subring 120 showing the wafer frame 110 and expanded subring 120', including showing a singulated wafer 125 on a dicing tape 118. The wafer frame 110 is generally circular and the dicing tape 118 is flat across the backside of the wafer frame 110 and across the opening in the wafer frame 110 before subring expansion/insertion. To secure the outer edge of the dicing tape 118 to the wafer frame 110 standard wafer frame taping is generally used to adhere the dicing tape to the downward facing portion of the wafer frame 110 and across the downward side.

The separation distance between the semiconductor die on the singulated wafer 125 can be <3 µm and the singulated wafer 125 can comprise a laser singulated wafer. The wafer frame 110 has an indentation 110a for holding the pieces of the expanded subring 120', and there are also caps 121 for placement on the top of the subring pieces after expansion for locking the dicing tape 118 in place.

The caps 121 can consist of a single piece. The caps 121 are designed to snugly fit on the subring pieces, so that there is no need for clips, pins, tabs, or punctures. The caps 121 are placed over all parts of the subring to keep them spaced. During tape and reel, there is additional expansion applied to the dicing tape 118 inside the subring 120. This additional expansion will tend to push the subring portions out of the indentation 110a. Without a cap 121 in place, the tape tension would pull the subring pieces together. The cap 121 prevents this. The adhesive force of the dicing tape 118 will also generally help keep the subring pieces in place in the indentation 110a due to tape tension as well.

The indentation 110a can comprise a ring around an inner surface of the wafer frame 110. There is no particular depth for the indentation 110a. However, the depth of the indentation 110a should be sufficient enough to hold the expanded subring 120' in place while under compressive force from the dicing tape 118. The depth of the indentation 110a may be about ⅓ to ½ of overall height of the subring 120. There is also a raised portion referred to as an inner lip 110b shown on the inner side of the indentation 110a. The inner lip 110b as shown helps keep the expanded subring 120' when in the indentation 110a from being pulled into the middle by the dicing tape 118 tension since the dicing tape 118 is on the outside and putting inward pressure on the expanded subring 120'.

The subring 120 being provided in separate pieces shown as 4 pieces enables it to then be inserted from underneath the wafer frame 110 as shown in FIG. 2A and after upward and outward travel to then be over (or beyond) the wafer frame 110 as shown in FIG. 2A. Due to the expansion, when the expanded subring 120' is above the level of the wafer frame 110 at least the outer diameter of the expanded subring 120' is larger than the inner diameter of the wafer frame 110. An electric motor drive system 160 is shown that drives a mechanical force applier 115a, 115b such as pistons that are each coupled to a translation guide 117a, 117b which are coupled to move the respective pieces of a disclosed subring 120. The electric motor drive system 160 creates a movement that extends the mechanical force applier 115a, 115b, such as pistons, and thus the translation guide 117a, 117b in both the horizontal and vertical (a multiaxial) direction. The v-shaped ends for the translation guides 117a, 117b shown in FIG. 2A are configured to support the subring 120 portions from the bottom to enable moving them in a disclosed multiaxial path.

Figure 2B:
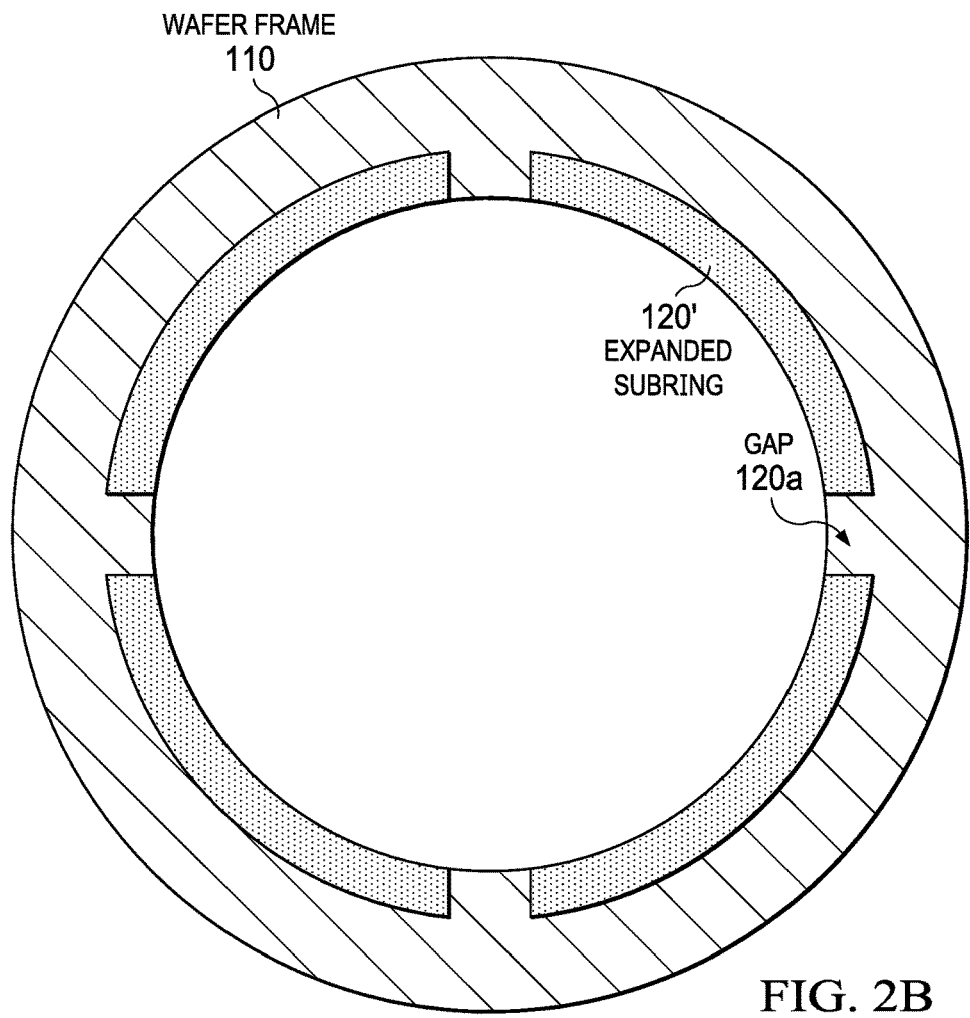
FIG. 2B is a top view depiction of a wafer frame and a subring of a disclosed die matrix expander after full expansion, where the subring is over the inner diameter of the wafer frame, and the gaps of the subring have widened, according to an example aspect.

FIG. 2B is a top view depiction of the wafer frame 110 and an expanded subring 120' of a disclosed die matrix expander after full expansion, where the expanded subring 120 is over the inner diameter of the wafer frame 110. In its translation up and out, the pieces of the subring 120 do not contact the wafer frame 110 at any point in its path of travel, and after full expansion the dicing tape is stretched to a top most stretched position that is above the wafer frame 110. As shown in FIG. 2B the inner diameter of the expanded subring 120' is about the same size as the inner diameter of the wafer frame 110. The gaps 120a of the expanded subring 120' can be seen to have widened which provides extra expansion for a singulated wafer beyond that provided by the subring assembly of a conventional die matrix expander that cannot provide the extra expansion, because as described above a conventional one-piece subring cannot be larger than the inner diameter of the wafer frame because the wafer frame is in the way of subring insertion.

The extra expansion provided by a disclosed die matrix expander for a singulated wafer being beyond that provided by the subring assembly of a conventional die matrix expander reduces semiconductor die chipping (front and/or back side) during the die pick process at die attach or tape and reel (TnR) operations. When the semiconductor die size shrinks, the die-to-die (D2D) gap provided by laser saw singulated die shrinks due to the same stretch area being shared among more semiconductor die. Small D2D gaps result in more die collisions. Without a disclosed subring 120 die sizes for laser saw singulated die, given the conventional constraint on maximum expansion to be limited by the inner diameter of the wafer frame, must generally remain be at or above 500 µm×500 µm. With a disclosed subring 120, due to the additional expansion provided that can provide a 30 µm die gap (such as for a 300 mm diameter wafer), die sizes for laser singulated die can be as small as about 200 µm×200 µm, and still allow for safe die picking from the dicing tape 118.

Figure 3:
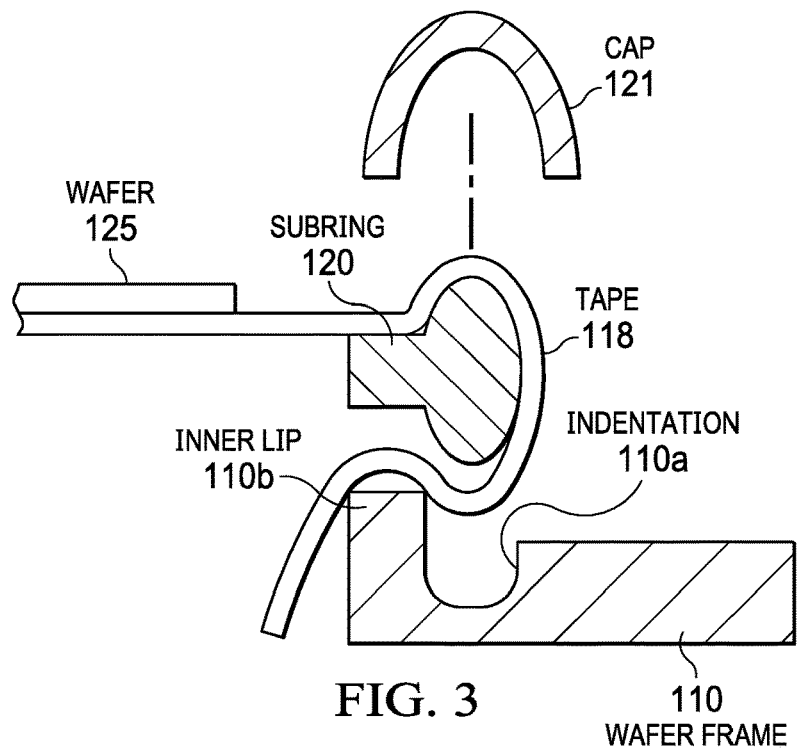
FIG. 3 is close-up side view depiction of the right side of some of the components of the die matrix expander shown in FIG. 2A.

FIG. 3 is close-up side view depiction of the right side of some of the components of the die matrix expander 200 shown in FIG. 2A. In operation, the cap 121 is generally placed over the respective subring 120 portions to lock the dicing tape 118 in place, then the respective pieces of the subring 120 are generally inserted into the indentation 110a. However, the sequence can also be lowering the pieces of the subring 120 into the indentation 110a, then applying the cap 121.

The cap 121 is generally one solid piece that is configured to hold the dicing tape 118 in place as well as maintains the radius during the pick process when an extra expansion is applied. The cap 121 thus ensures that the dicing tape 118 is locked in the most stretched position and also ensures that the subring's 120 pieces will remain in their set position. The cap 121 is generally mechanically lowered and pressed into place for clamping the dicing tape 118. As with FIG. 2A, the wafer frame 110 includes an inner lip 110b on the inner side of the indentation 110a.

Figure 4:
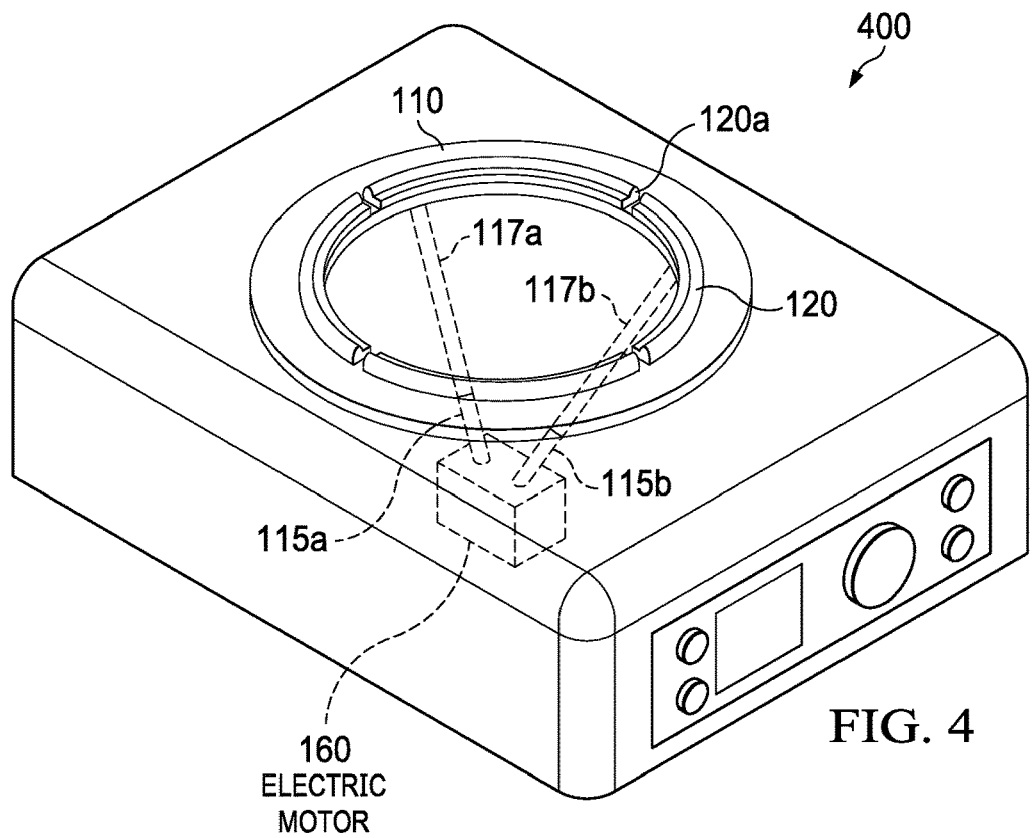
FIG. 4 is a block diagram depiction of a die matrix expander that has an electric motor drive system coupled to drive a mechanical force applier such as pistons which move translation guides that are for supporting/holding the respective pieces of a disclosed subring.

FIG. 4 is a block diagram depiction of a die matrix expander 400 that has an electric motor drive 160 coupled to drive a mechanical force applier such as pistons (not shown) which move translation guides 117a, 117b that are for supporting/holding the respective pieces of a disclosed partitioned subring 120 which are configured to move the subring 120 up in a multiaxial fashion that increases the diameter of the subring 120 as the path goes up.

EXAMPLES

Disclosed aspects are further illustrated by the following specific Examples, which should not be construed as limiting the scope or content of this Disclosure in any way.

A known subring that holds a D2D gap shrinks the maximum, expanded singulated wafer radius for a 300 mm diameter wafer from 350 mm to 331 mm. By implementing a disclosed partitioned subring 120, one extends this area by 19 mm to 350 mm which allows for an extra 19 mm to be distributed among the various die gaps. This enables a 30 µm D2D gap on a 300 mm diameter wafer with a 200×200 µm die size. However, a redesign of the wafer frame's 110 diameter can increase or decrease this number. For example, redesigning the wafer frame itself can yield an inner diameter and pick radius change from the particular design that was tested.

Those skilled in the art to which this Disclosure relates will appreciate that many other variations are possible within the scope of the claimed invention, and further additions, deletions, substitutions and modifications may be made to the described aspects without departing from the scope of this Disclosure.

The invention claimed is:

1. A die matrix expander, comprising:
   a partitioned subring including at least 3 pieces;
   a wafer frame for supporting a dicing tape having an indentation configured for receiving the pieces of the subring;
   wherein the subring prior to expansion sits below a level of the wafer frame and the subring has an outer diameter that is less than an inner diameter of the wafer frame;
   a translation guide coupled to the subring driven by a mechanical force applier for moving the subring pieces in an angled path upwards and outwards to not contact the wafer frame at any point in a path of travel for stretching the dicing tape including to a top most stretched position that is above the wafer frame, wherein when fully expanded the subring sits over or outside the wafer frame when above the wafer frame, and
   a cap for positioning on the pieces of the subring after being fully expanded over the dicing tape for locking the dicing tape in the top most stretched position and for securing the pieces of the subring in place including when within the indentation during an additional expansion during a subsequent die pick operation.

2. The die matrix expander of claim 1, wherein the subring has 4 pieces.

3. The die matrix expander of claim 1, wherein the cap consists of a single piece.

4. The die matrix expander of claim 1, wherein the subring is 1 to 8 mm thick.

5. The die matrix expander of claim 1, wherein in the top most stretched position the inner diameter of the subring is beyond the outer diameter of the wafer frame.

6. The die matrix expander of claim 1, wherein the mechanical force applier comprises pistons.

7. The die matrix expander of claim 1, wherein the wafer frame includes an inner lip for holding the subring in place in the indentation.

8. The die matrix expander of claim 1, wherein the indentation comprises a ring.

9. A method of die matrix expanding, comprising:
   beginning with a partitioned subring including at least 3 pieces that sits below a wafer frame that has an indentation, with a dicing tape across the wafer frame having a singulated wafer with a plurality of semiconductor die on the dicing tape;
   extending the pieces of the subring up in a height direction above the wafer frame and out in a lateral direction to not contact the wafer frame at any point in a path of travel for stretching the dicing tape including to a top most stretched position that is above the wafer frame, wherein the subring when fully expanded sits over or outside the wafer frame when above the wafer frame;
   lowering a cap from above for locking the dicing tape into place to keep the dicing tape locked in a most stretched position and to ensure that the pieces of the subring after being fully expanded will remain in their set position, and
   lowering the subring into the indentation.

10. The method of claim 9, wherein the lowering the cap is before the lowering of the subring.

11. The method of claim 9, wherein a die matrix expander utilized for the method includes translation guides coupled to the subring driven by a mechanical force applier for moving the subring pieces, wherein the method is fully automated, comprising:
   bringing the wafer frame over an insertion area where the subring sits below the insertion area;
   after the extending the cap is lowered from above to lock the dicing tape in place,
   pressing the pieces of the subring in the indentation, and
   retracting the translation guides.

12. The method of claim 9, wherein a separation between the semiconductor die is <3 μm and the singulated wafer comprises a laser singulated wafer.

13. The method of claim 12, wherein the singulated wafer has a diameter of at least 300 mms, a die size of the semiconductor die is <500 μm on at least one side, and after the extending the separation between the semiconductor die is at least 30 μm.

14. The method of claim 9, wherein the subring has 4 pieces.

15. The method of claim 9, wherein the cap consists of a single piece.

16. The method of claim 9, wherein the subring is 1 to 8 mm thick.

17. The method of claim 9, wherein in the top most stretched position an inner diameter of the subring is beyond an outer diameter of the wafer frame.

18. The method of claim 9, wherein the mechanical force applier comprises pistons.

19. The method of claim 9, wherein the indentation comprises a ring.

20. A method of separating semiconductor die, comprising:
   singulating a wafer on a dicing tape that has a plurality of the semiconductor die into singulated die;
   beginning with a partitioned subring including at least 3 pieces that sits below a wafer frame that has an indentation, positioning the dicing tape having the wafer with the singulated die on a backside of the wafer frame across an opening of the wafer frame;
   extending the pieces of the subring up in a height direction above the wafer frame and out in a lateral direction to not contact the wafer frame at any point in a path of travel for stretching the dicing tape including to a top most stretched position that is above the wafer frame, wherein the subring when fully expanded sits over or outside the wafer frame when above the wafer frame;
   lowering a cap from above for locking the dicing tape into place to keep the dicing tape locked in a most stretched position and to ensure that the pieces of the subring after being fully expanded will remain in their set position, and
   lowering the subring into the indentation.

\* \* \* \* \*